Dec. 8, 1970 R. H. CORNELY 3,546,495

SEMICONDUCTOR LASER LOGIC APPARATUS

Filed Feb. 7, 1968

INVENTOR
ROY H. CORNELY

BY Carl V. Olson

ATTORNEY

United States Patent Office 3,546,495

Patented Dec. 8, 1970

3,546,495

SEMICONDUCTOR LASER LOGIC APPARATUS

Roy H. Cornely, Skillman, N.J., assignor to RCA Corporation, a corporation of Delaware Filed Feb. 7, 1968, Ser. No. 703,669
Int. Cl. H03k *19/14*
U.S. Cl. 307—312 5 Claims

ABSTRACT OF THE DISCLOSURE

An optical laser inverter logic unit formed on a single semiconductor crystal wafer having a planar p-n junction near the top surface thereof. The top surface of the crystal is selectively removed to a depth below the p-n junction to leave junction material forming an elongated oscillator channel having reflective sides and at least partially reflective ends, an integral elongated input amplifier channel angularly related at about 30 degrees to the elongated oscillator channel near one end thereof, and an integral amplifier signal attenuator on one side of the elongated oscillator channel near the opposite end thereof. A source of biasing or pumping electrical power is connected to a first integral electrode on the exposed top surface over the oscillator channel and the amplifier channel, and to a second electrode on the bottom surface of the semiconductor crystal. The logic unit and other units are constructed by etching. The removed material is replaced by silicon oxide to provide additional support for the first integral electrode.

The invention herein described was made in the course of or under a contract or subcontract thereunder with the Department of the Air Force.

BACKGROUND OF THE INVENTION

The invention relates to the use of semiconductor laser diodes employed for the purpose of performing computer logic functions on information signals in the form of light. The use of light signals, in place of electrical signals, has the advantage of providing the ultimate in speed of signal transmission and signal interaction. The construction of a logic unit comprising a plurality of discrete, individual semiconductor laser diodes presents many difficult problems. The junction regions which channel the laser light from one unit to another must be in perfect alignment and in very close proximity. Also, it is difficult to adequately define and control the paths taken by the laser light. It is therefore a general object of this invention to provide an improved semiconductor laser logic system by which the light signals are kept under control in the performance of computer logic functions, which permits a high density laser functional unit in a given area or volume and which is relatively easy to manufacture. It is a more specific object to provide a laser logic system including logic elements which, because of their geometry and dimensions, require relatively very low direct current pumping power.

SUMMARY OF THE INVENTION

According to an example of the invention, semiconductor laser oscillators and amplifiers are constructed to have a relatively very narrow width compared with their length. To minimize the amount of pumping power required for their operation, an oscillator and an amplifier are constructed in integral form with the amplifier channel connected to the oscillator channel near one end thereof at an angle of about 30°. The light signal from the amplifier reflects back and forth between the sidewalls of the oscillator and quenches the normally existing longitudinal oscillations in the oscillator. An attenuator integral with the oscillator in the other end thereof receives and attenuates solely the light signals from the amplifier. Many such laser elements are constructed on a single semiconductor wafer having a p-n junction by selectively etching from one surface through the junction.

DESCRIPTION OF THE PREFERRED EMBODIMENTS

Figure 1:
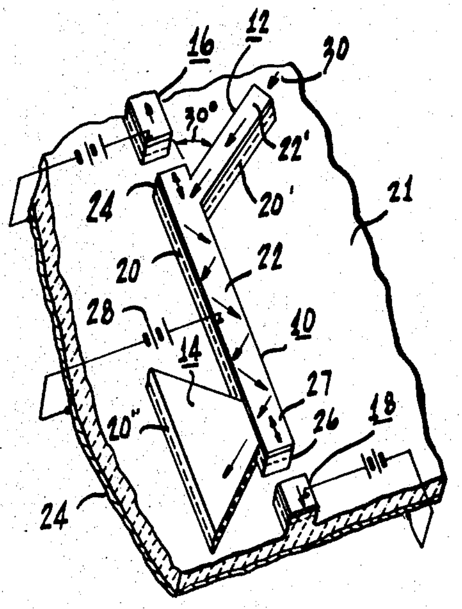
FIG. 1 is a perspective view of a semiconductor laser logic unit according to the invention.

Reference is now made in greater detail to FIG. 1 showing a semiconductor laser logic unit. The unit consists of an elongated laser oscillator 10, an elongated laser amplifier 12 integral with oscillator 10 and connected near one end thereof at an angle of about 30°, and an attenuator 14 integral with oscillator 10 near the other end thereof. Output channels 16 and 18 are located at respective ends of the elongated oscillator 10.

The oscillator 10 includes a planar junction 20 in a body of semiconductor crystal material having a p type material on one side of the junction and an n type material on the other side of the junction. The semiconductor material immediately above and below the junction has the illustrated shape to define a laser oscillator channel constituted by the junction region 20. The semiconductor material below the junction 20 includes an integral supporting substrate 21. A metallic planar electrode 22 is provided on the top planar surface of the semiconductor crystal, and a second electrode 24 is provided on the bottom planar surface of the semiconductor crystal. A source 28 of bias potential is connected across the electrodes 22 and 24. The ends and sides of the planar junction region 20 of the oscillator 10 are sufficiently smooth to provide an elongated planar light confining channel. The ends 24 and 26, however, may be only partially reflective to permit light outputs from the oscillator 10 to the output channels 16 and 18. The oscillator 10 has a length dimension between the ends 24 and 26 which is selected to provide a resonator for light energy oscillations of a given desired wavelength determined by the semiconductor laser material in the junction region 20.

The elongated semiconductor laser amplifier 12 is integral with the oscillator 10 and similarly includes a junction region 20' coplanar with the junction region 20 of oscillator 10, an upper electrode 22' integral with the upper electrode 22 of the oscillator 10, and a bottom electrode 24 common to both the amplifier 12 and the oscillator 10.

The attenuator 14 includes a planar junction region 20'' which is coplanar with, and integral with, the junction region 20 of oscillator 10. The attenuator 14 does not have an electrode on its top surface, and, therefore, the attenuator junction region 20'' does not receive electrical pumping energy, so that it absorbs, rather than amplifies, the optical signal. The attenuator 14 is fan-shaped and integral with a portion of the side of the oscillator 10 to collect light reflected from the sides of the oscillator. The attenuator connection extends along less than one fifth of the length of the oscillator. The attenuator connection or entrance has a dimension about five times as great as the width of the oscillator junction 20. The sides of the attenuator 14 are made rough or otherwise nonreflective to scatter light not absorbed in the attenuator and tending to leave the attenuator, so that light is not reflected from the attenuator back into the oscillator 10.

The output channels 16 and 18 are constructed with junction regions that are coplanar with the junction region 20 of oscillator 10. The output channels receive light energy from the oscillator 10, and amplify and direct it to other logic elements or utilization devices. The gaps between the output channels and the oscillator are made as small as possible and should preferably be less than the thickness of the junction region.

The elongated oscillator 10 is constructed to have a length much greater than its width. The length is preferably about 1 microns, or 0.0002 milliinch. The width of the elongated oscillator channel is less than 10 times the wavelength of the oscillator laser light. The oscillator laser may be constructed of gallium arsenide semiconductor material, and the elongated oscillator may have a length of 1 to 10 milliinches. Under these conditions, the laser oscillations may have a wavelength of 8400 angstroms at 77 degrees Kelvin. The amplifier 12 and the output channels 16 and 18 are similarly constructed with a relatively narrow width.

The construction of the oscillator, amplifier, and output channels with a relatively very arrow width has the advantage that laser action is established and maintained with a relatively very low amount of bias or pumping power. The pumping power required for operation of a logic unit at a temperature of about 77° Kelvin is about 10 milliamperes or less. The minimization of pumping power requirement is important, especially in systems including a high density of semi-conductor logic elements in a small space.

In the operation of the laser inverter logic unit of FIG. 1, the biasing source 28 causes laser oscillations in the junction region 20 of the oscillator 10. The oscillations are created and maintained solely in the longitudinal direction with a laser mode frequency spacing determined by the distance between the partially reflective ends 24 and 26, and with a center frequency determined by the band gap energy characteristic of the particular semiconductor material employed. The oscillator 10 thus is normally in the oscillating condition supplying output light to one or both of the output channels 16 and 18.

An input light signal 30 may be applied to the remote end of the amplifier 12 from any suitable source such as an oscillator like oscillator 10. The input light signal 30 is amplified in the amplifier 12 and conveyed through the junction region 20′ to the junction region 20 of the oscillator 10. The amplified light from the amplifier 12 follows a path, shown by the arrows, reflecting back and forth from the sides of oscillator 10 until it nears the other end of the oscillator and enters the attenuator 14, where the light is absorbed and scattered or otherwise attenuated. Because of the angle at which light from the amplifier 12 enters the oscillator 10, and because of the geometry of the unit, all but an insignificant portion of the light from the amplifier 12 is prevented from leaving the ends 24 and 26 of the oscillator. The light from amplifier 12 in passing through the junction region 20 of the oscillator 10 causes a sufficient decrease in the amplification of the oscillations in the junction region 20 to quench or extinguish the laser oscillations existing in the longitudinal direction 27. The unit therefore operates as a logic signal inverter in that there is at least one output from the oscillator 10 until such time as a light signal 30 is applied through the amplifier 12 to the oscillator 10. The output from the oscillator is then inhibited until such time as the input light signal 30 is terminated. Thereafter, the oscillator 10 oscillates and provides its normal output light signal.

Figure 2:
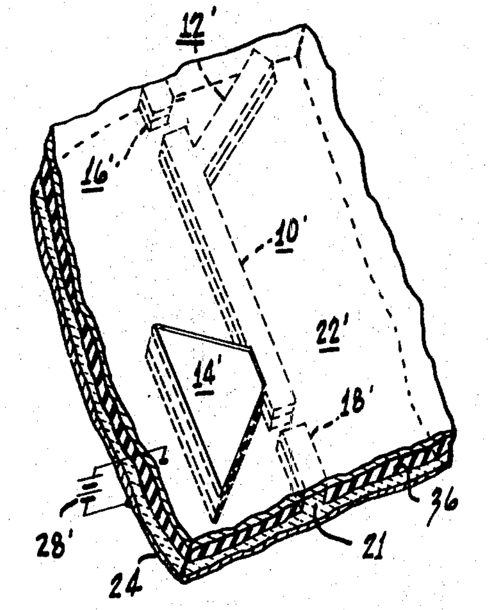
FIG. 2 is a perspective view of another unit similar to that shown in FIG. 1 but constructed in a preferred manner.

FIG. 2 shows a semiconductor laser logic unit which is functionally the same as the unit of FIG. 1. The unit of FIG. 2 differs in that it includes an insulating material 36 such as silicon oxide. The insulating material is deposited on the semiconductor supporting substrate 21 with a thickness so that its upper surface is flush with the upper surface of the semiconductor material forming the oscillator 10′, the amplifier 12′, the attenuator 14 and the output channels 16′ and 18′. The flush surface thus established supports a planar upper electrode 22′ which is coextensive with the supporting substrate 21.

A single common bias or pumping power source 28′ is connected across the upper electrode 22′ and the bottom electrode 24. The pumping power source 28′ serves the oscillator 10′, the amplifier 12′, and the output channels 16′ and 18′. The portion of the upper electrode 22′ over the attenuator 14′ is removed as by etching or by any other suitable process. Alternatively, the attenuator is masked when the upper electrode is laid down. Since there is no upper electrode over the attenuator 14′, no pumping power is supplied to the junction region of the attenuator and no laser action (light amplification) is produced or maintained therein.

Method of construction

Figures 3A, 3B, 3C:
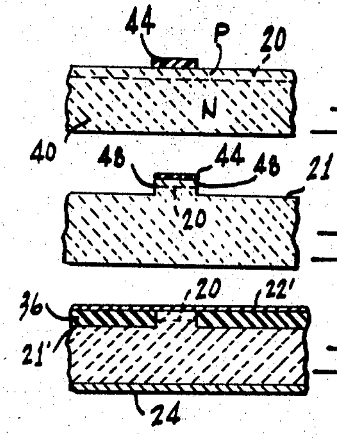
FIGS. 3A through 3C illustrate several steps in a method of constructing the unit shown in FIG. 2.

Reference is now made to FIGS. 3A through 3C for a description of a method by which a logic system including the logic unit of FIG. 2 may be constructed. FIG. 3A shows a fragmentary portion of a semiconductor wafer 40 having a p-n junction 20. The semiconductor wafer 40 may be of a gallium arsenide material having a p region above the junction 20 and an n region below the junction 20. The semiconductor wafer may have a thickness of about 4 milliinch, and have the p-n junction 20 about 2 microns from the top surface. The p-type material and the junction 20 may be formed in an n-type wafer by vapor phase deposition, solution regrowth, or diffusion.

A logic element, such as a laser oscillator unit, is created by forming a photoresist material 44 in the desired shape of the logic element. The photoresist layer 44 may have a thickness from 0.5 to 5 microns.

The photoresist layer is polmyerized in the geometry of the logic element by exposure through a mask using well-collimated light, or by exposure to a scanned electron beam. The use of an electron beam is advantageous because it has a very high energy density in a very finely focused spot of about 0.1 micron. The polymerized photoresist pattern can be produced with a very steep side and an edge resolution of about 0.01 micron. This method is particularly desirable in establishing the gap between the end of the oscillator and the output amplifier. This gap should be less than 1 micron and preferably be about 0.1 micron. The unpolymerized photoresist is removed by a suitable solvent or etchant.

The polymerized photoresist is effective to shield the semiconductor crystal while the exposed surface of the crystal is removed to a depth below the junction region 20. The semiconductor material is removed by ion bombardment (sputtered etching), which is a technique that can remove material at a slow and well-controlled rate of 100 to 200 angstroms per minute without introducing deep surface damage. The etching also affects the photoresist 44, but the etching of the gallium arsenide crystal proceeds at a rate at least three times faster than the rate at which the photoresist is etched. Therefore, in the thicknesses described, the etching proceeds to the condition as illustrated in FIG. 3B before the photoresist has been significantly eroded away. As shown in FIG. 3B, the etching of the semiconductor crystal to a depth 21 beyond junction region 20 produces smooth steep sides 48 defining the boundaries of the light-confining channel within the junction region 20. The photoresist 44 is then removed with a suitable solvent.

As shown in FIG. 3C, the semiconductor material etched away is replaced by an isolating non-conductive material having a low refractive index. Silicon oxide is a suitable insulating material having a refractive index of 1.2 to 1.5, which is effective to maintain the sidewalls 48 inwardly reflective to incident light at angles of 30° or more. The silicon oxide may be deposited by evaporation or other means. The top surface of the silicon oxide insulating material may be lapped flush with the top surface of the p-type semiconductor material.

Top and bottom electrodes 22' and 24 are then deposited by any suitable method on the top and bottom surface of the assembly as shown in FIG. 3C. The portion of the top electrode 22' over the attenuator 14' in the assembly of FIG. 2 may be removed by etching or any other suitable process.

Figure 4:
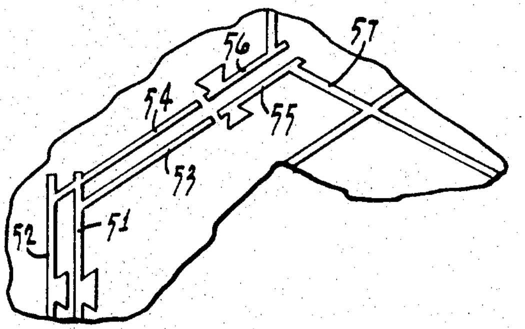
FIG. 4 is a diagram illustrating an arrangement of a plurality of logic units on a single semiconductor wafer.

FIG. 4 shows a plan view of a number of semiconductor logic units in various coupled and decoupled relationships on a semiconductor wafer. Oscillators 51 and 52 are supplied with quenching light signals from amplifiers 53 and 54, respectively. The amplifier 54 crosses through a portion of oscillator 51 on its way to oscillator 52. Because of the high length-to-width ratio of the laser elements, there is no significant coupling of energy from the amplifier 54 to the oscillator 51. The energy goes directly through the oscillator 51 to the oscillator 52.

The amplifiers 53 and 54 receive input light signals from oscillators 55 and 56. A quenching signal can be sent to oscillator 55 from an amplifier 57. The illustrated angular relationships of the elongated laser elements permits the construction of many logically interrelated laser elements on a small area. Elements can cross each other where desirable without signal coupling between the crossed elements. Therefore, complex logic systems employing laser light information signals can be constructed on a single semiconductor wafer by following the teachings of this invention.

Figure 5:
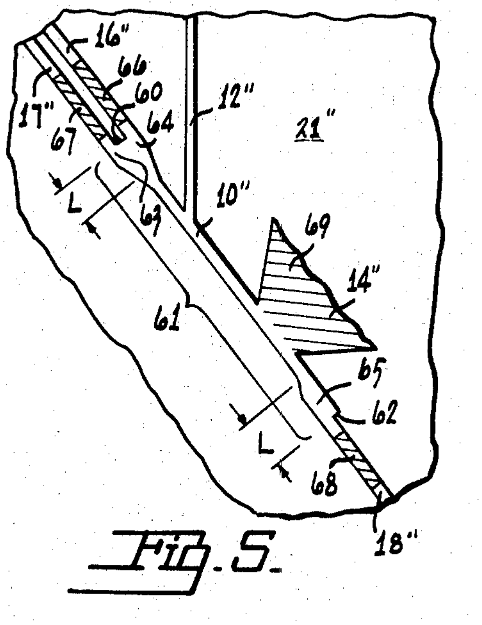
FIG. 5 is a diagram of a semiconductor logic unit like those of FIGS. 1 and 2 but constructed with a preferred geometry.

The embodiment of FIG. 5

FIG. 5 is a diagram illustrating a semiconductor laser logic unit similar to the units of FIGS. 1 and 2 but differing in geometry for the purpose of avoiding the need for gaps in the light transmitting channels between the laser oscillator and the output channels. The oscillator 10'' has a resonant length 61 determined by the distance between two totally reflecting end surfaces 60 and 62 constructed by applying an electrically insulating film of silicon dioxide followed by a film of gold. Side edges of the junction region constituting the oscillator 10'' are integral at 63, 64 and 65 over a length L with side edges of the junction regions of output signal channels 16'', 17'' and 18'' to provide gapless light couplings from the oscillator to the output channels. The junction region of oscillator 10'' extends continuously in unitary side-by-side relation along portions of its length with portions of the lengths of the output amplifiers 16'', 17'' and 18''.

Because of the narrow width of the elongated oscillator 10'', proportions of the laser oscillations in oscillator 10'' are coupled to the output channels by a diffraction effect or by a transmission of off-axis modes. If the oscillator and output channels have a width of 5 microns, and if the laser signal wavelength is 0.8 micron, the dimension L of the coextensive portions of the oscillator and output channel should be greater than 1.2 milliinches, and should typically be about 2 milliinches in order to couple all of the diffracted energy.

The junction region of oscillator 10'' is also, as before, in uninterrupted angular communication with the junctions regions of input channel 12'' and attenuator 14''. The logic unit of FIG. 5 differs from the units of FIGS. 1 and 2 also in that three outputs are obtained from the oscillator, rather than two. The unit may be constructed with a greater or a lesser number of outputs.

The lines in FIG. 5 depicting the oscillator, input channel, output channels and attenuator represent the outlines of the junction region outside of which the junction has been removed by etching. A top electrode may be provided over solely the remaining portion of the top surface as described in connection with FIG. 1, or over the entire top surface as described in connection with FIG. 2. In either case, the shaded areas 66, 67, 68 and 69 in FIG. 5 represent junction regions over which there is no top conductor to provide pumping energy to the junction regions therebelow. The unpumped regions 66, 67 and 68 of the output amplifiers 16'', 17'' and 18'' provide attenuation of stray light signals from oscillator 10'' which are below a given threshold. By this construction, the output channels deliver output signals only when oscillator 10'' is lasing.

The semiconductor laser logic unit of FIG. 5 has the important advantage of not requiring gaps in the junction region between the ends of the oscillator and the output channels. Such gaps, as shown in FIGS. 1 and 2, must be very narrow in order to achieve a transfer of oscillator energy to the output channels without losses. The gaps are difficult to make in the extremely small dimension necessary. The problem of making gaps is avoided in the construction of FIG. 5 where a small but sufficient amount of laser energy in the oscillator 10'' is coupled through the integral side-by-side portions L of the oscillator 10'' and the output channels. In other respects, the arrangement of FIG. 5 is similar in construction and operation to the arrangement of FIGS. 1 and 2.

What is claimed is:

1. An optical laser inverter logic unit comprising a semiconductor crystal having a p region and an n region and having a planar junction between said regions, the top surface parallel to said planar junction of said crystal being selectively removed to a depth below said planar junction to leave junction material forming an elongate oscillator channel having reflective sides and at least partially reflective ends, an integral elongated input amplifier channel angularly related to said elongated oscillator channel near one end thereof and having an optical signal input terminal end, and an integral amplifier signal attenuator on one side of said elongated oscillator channel near the opposite end thereof, said channels being angularly related so that light supplied from the input amplifier channel to the oscillator channel follows a zig-zag course between the sidewalls of the oscillator channel until it reaches and enters said signal attenuator and is dissipated, a first integral electrode on the exposed top surface over said oscillator channel and said amplifier channel, a second electrode on the bottom surface of said semiconductor crystal, a source of bias potential connected across said first and second electrodes, whereby laser oscillations are established in said elongated oscillator channel and an optical output is provided from at least one end thereof, and means to direct an optical signal to the input end of said amplifier channel, whereby said input signal is amplified in said amplifier channel and in said oscillator channel to cause quenching of said oscillations.

2. A laser inverter as defined in claim 1 wherein said elongated oscillator channel has a width less than ten times the wave length of the oscillator laser light.

3. A laser inverter as defined in claim 2 wherein said elongated oscillator channel has a length at least twenty-five times its width.

4. A laser inverter as defined in claim 3 wherein said amplifier signal attenuator connection extends along less than one-fifth the length of said oscillator channel.

5. A laser inverter as defined in claim 4 wherein said amplifier signal attenuator increases in width as it leaves the oscillator channel.

(References on following page)

References Cited

UNITED STATES PATENTS

| | | | |
|---|---|---|---|
| 3,427,563 | 2/1969 | Lasher | 307—312 |
| 3,431,437 | 3/1969 | Kosonocky | 307—312 |
| 3,431,438 | 3/1969 | Newman | 307—312 |
| 3,439,289 | 4/1969 | Kosonocky | 307—312 |
| 3,470,491 | 9/1969 | MacNeille | 307—312 |

ROY LAKE, Primary Examiner

D. R. HOSTETTER, Assistant Examiner

U.S. Cl. X.R.

29—569; 307—213, 214, 231

UNITED STATES PATENT OFFICE

CERTIFICATE OF CORRECTION

Patent No. 3,546,495 Dated December 8, 1970

Inventor(s) Roy H. Cornely

It is certified that error appears in the above-identified patent and that said Letters Patent are hereby corrected as shown below:

| | | |
|---|---|---|
| Column 3 | line 17 | Change "1" to ---5---. |
| | line 22 | Change "1" to ---5---. |
| | line 28 | Change "arrow" to ---narrow---. |
| | line 61 | After "from" insert ---the---. |
| Column 4 | line 32 | Change "milliinch" to ---milliinches---. |
| Column 6 | line 1 | After "In" delete --- - ---. |
| Claim 1 | line 8 | Change "elongate" to ---elongated---. |

SIGNED AND SEALED

MAR 9 1971

(SEAL)

Attest:

Edward M. Fletcher, Jr.
Attesting Officer

WILLIAM E. SCHUYLER, JR
Commissioner of Patents

FORM PO-1050 (10-69)

USCOMM-DC 60376-I